(12) United States Patent
Howell et al.

(10) Patent No.: US 6,508,659 B1
(45) Date of Patent: Jan. 21, 2003

(54) ELECTRICAL SOCKET HAVING A BACKUP MEANS

(75) Inventors: David Gregory Howell, Gilbert, AZ (US); Yao-Chi Huang, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/090,222

(22) Filed: Mar. 1, 2002

(51) Int. Cl.⁷ ............................................... H01R 13/62
(52) U.S. Cl. ....................................... 439/342; 439/259
(58) Field of Search ........................... 439/342, 259–270

(56) References Cited

U.S. PATENT DOCUMENTS

| | | | | |
|---|---|---|---|---|
| 6,280,223 B1 | * | 8/2001 | Lin | 439/342 |
| 6,338,639 B1 | * | 1/2002 | Trout et al. | 439/342 |
| 6,406,317 B1 | * | 6/2002 | Li et al. | 439/342 |
| 6,435,893 B1 | * | 8/2002 | Kasahara | 439/342 |

* cited by examiner

Primary Examiner—Hien Vu
(74) Attorney, Agent, or Firm—Wei Te Chung

(57) ABSTRACT

An electrical socket (1) for supporting an integrated circuit chip on a circuit board mainly comprises a non-conductive base (10), a plurality of conductive contacts (20) retained in the base, a slidable cover (30) and an actuator member (40) for moving the slidable cover with respect to the base. The base defines a receiving space (100) for receiving the actuator member and a recessed portion (109) adjacent to the receiving space. The cover forms a projection member (36) which projects from a bottom surface thereof beyond an adjacent side edge thereof to be slidably received in the recessed portion. The actuator member pushes the projection member to move to its predetermined closed position where the pins of the integrated circuit chip are electrically connected with the conductive contacts, once it is worn after being repeatedly operated or the cover creeps.

7 Claims, 8 Drawing Sheets

ELECTRICAL SOCKET HAVING A BACKUP MEANS

BACKGROUND OF THE INVENTION

1. Field of the Invention

The present invention relates to an electrical socket, and particularly to a central processing unit (CPU) socket for supporting an integrated circuit chip on an underlying printed circuit board (PCB).

2. Description of Prior Art

CPU sockets are well known in the computer industry and used for supporting an integrated circuit chip on an underlying circuit board. Thus, the CPU sockets are very competitive in markets and one which has a good performance while maintaining low manufacturing cost is undoubtedly predominant. Commonly, a CPU socket has a non-conductive base defining an array of terminal holes, a plurality of conductive contacts retained in corresponding terminal holes, a slidable cover mounted on the base, and an actuator member assembled with the base and the cover. The actuator member is adapted for moving the cover with respect to the base from an open position where the pins of the integrated circuit chip are disconnected from the conductive contacts to a closed position where the pins are electrically and mechanically connected with the conductive contacts. However, the actuator member may be worn after being repeatedly operated, or the cover and/or the base may creep. Thus, an intended stroke for driving the cover may not be enough to exactly move the cover to the predetermined closed position, thereby adversely affecting the connection between the pins of the integrated circuit chip and the conductive contacts, for example, U.S. Pat. No. 6,280,223 having the same assignee with the invention.

Hence, an improved electrical socket is required to overcome the disadvantages of the prior art.

BRIEF SUMMARY OF THE INVENTION

A first object of the present invention is to provide a CPU socket having a backup means which can ensure a reliable connection between the pins of an integrated circuit chip and conductive contacts of the CPU socket even if the actuator member of the CPU socket is worn after being repeatedly operated or the cover creeps.

A second object of the present invention is to provide a CPU socket having a backup means which is easily manufactured.

An electrical socket in accordance with the present invention is adapted for supporting an integrated circuit chip on a circuit board, and comprises a non-conductive base defining an array of terminal holes, a plurality of conductive contacts received in the terminal holes, a slidable cover mounted on the base and an actuator member for moving the slidable cover with respect to the base. The base defines a receiving space in one side thereof for receiving the actuator member and a recessed portion adjacent to the receiving space. The cover defines an array of pin holes corresponding to the terminal holes for insertion of pins of the integrated circuit chip. A projection member is formed on a bottom surface of the cover for being slidablely received in the recessed portion of the base. The actuator member forms a cam shaft driving the cover moving and an operating handle vertically extending from the cam shaft and rotatable from its horizontal position to its vertical position with respect to the base. The operating handle pushes the projection member moving in the recessed portion once it is worn after being repeatedly operated or the cover creeps, such that the cover moves effectively between an open position wherein the pins of the integrated circuit chip are disconnect from conductive contacts and an closed position wherein the pins are mechanically and electrically connected with the conductive contacts.

Other objects, advantages and novel features of the invention will become more apparent from the following detailed description of the present embodiment when taken in conjunction with the accompanOying drawings.

DETAILED DESCRIPTION OF THE INVENTION

Reference is now be made to drawing figures for detailedly description of the present invention.

Figure 1:
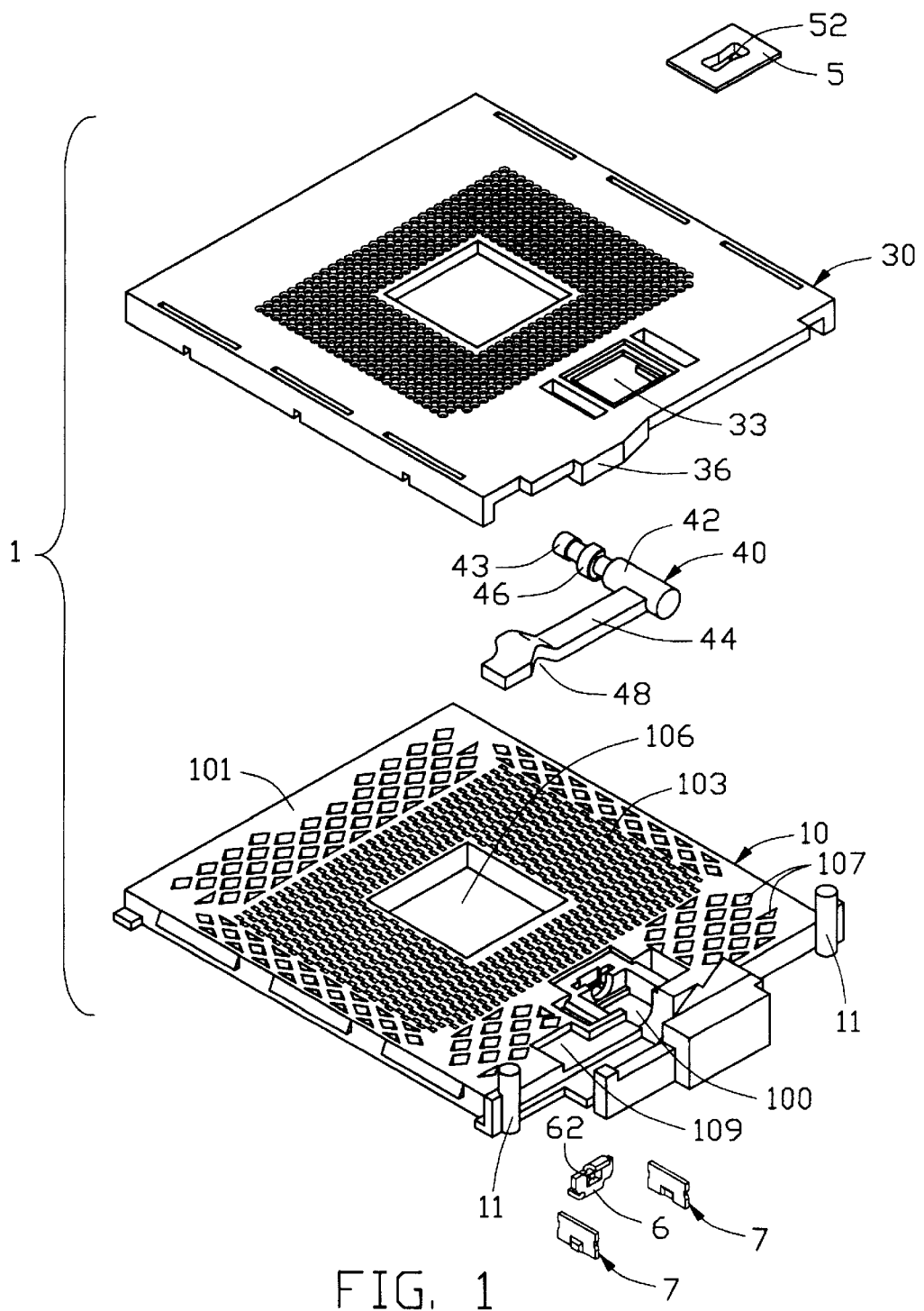
FIG. 1 is an exploded perspective view of an electrical socket in accordance with the present invention.

Referring to FIG. 1 first, a CPU socket 1, named as a ZIF BGA socket, in accordance with the present invention mainly comprises a non-conductive base 10, a plurality of conductive contacts (not shown) retained in the base 10, a movable cover 30 covered on the base 10 and an actuator member 40 assembled with the base 10 and the cover 30.

Figure 2:
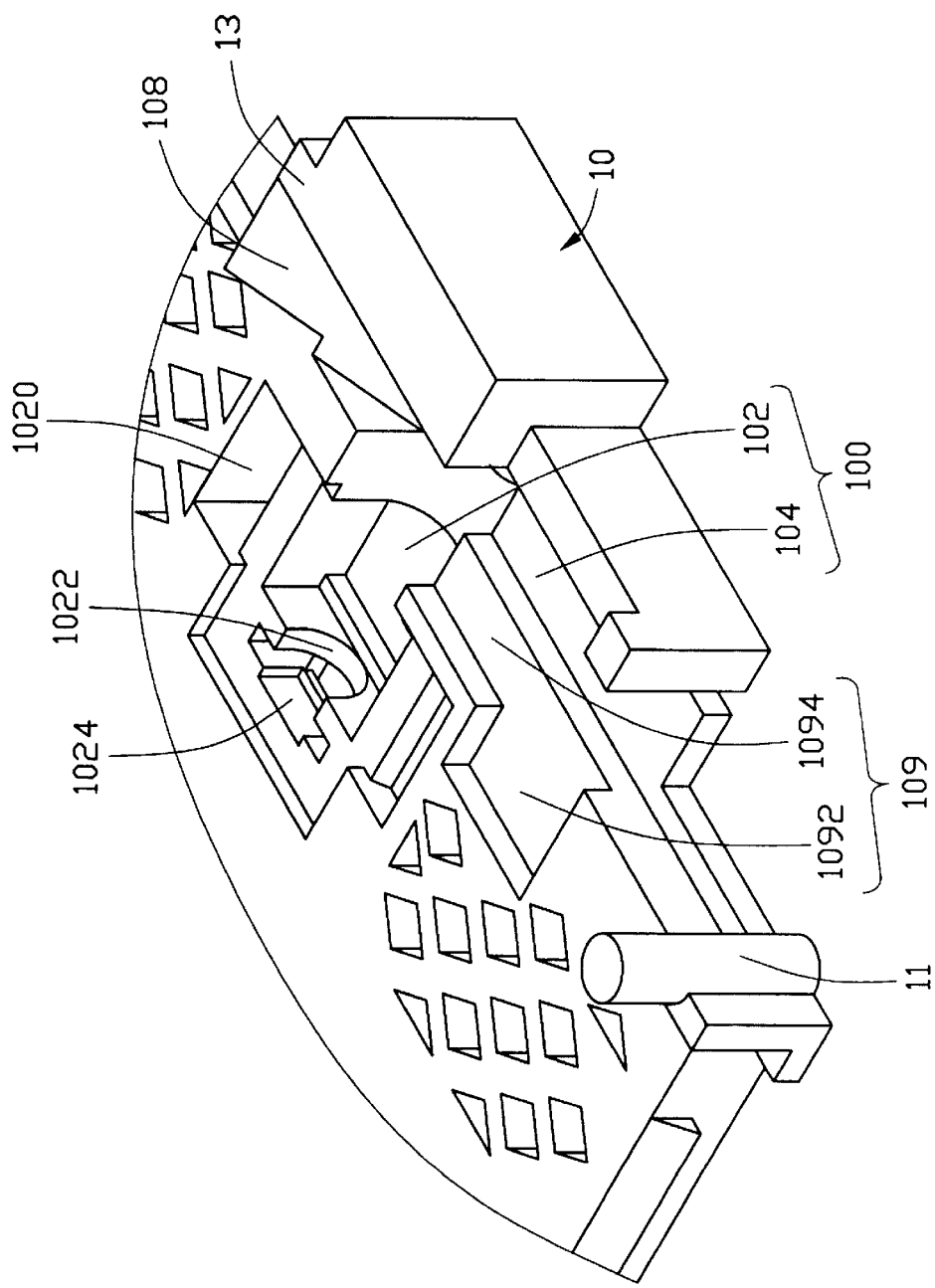
FIG. 2 is a partial perspective view of a non-conductive base of the electrical socket of FIG. 1.

Further referring to FIG. 2, the non-conductive base 10 defines an array of terminal holes 103 around a central opening 106 thereof for receiving a corresponding number of conductive contacts, and an array of through holes 107 further around the terminal holes 103. A receiving space 100 is defined in a top face 101 of the base 10 for receiving the actuator member 40, and includes a receiving chamber 102 among the through holes 107 and a receiving slot 104 laterally extending along one lateral side 13 of the base 10 and communicating with the receiving chamber 102. An arc-shaped opening 1022 is communicatively defined at one end of the receiving chamber 102, and a pair of through slots 1020 are defined at opposite lateral sides of the receiving chamber 102. The base 10 further defines a receiving slit 1024 communicated with the opening 1022. Additionally, the lateral side 13 of the base 10 forms an inclined block 108 at the common boundary of the receiving slot 104 and the receiving chamber 102 for preventing the actuator member 40 unduly rotating. A pair of stopping posts 11 is further formed at opposite ends of the lateral side 13. Furthermore, the top face 101 of the base 10 flier defines a recessed portion 109 adjacent to the receiving slot 104 and has a wide recess 1092 and a narrow recess 1094 communicatively extending from the wide recess 1092.

Figure 3:
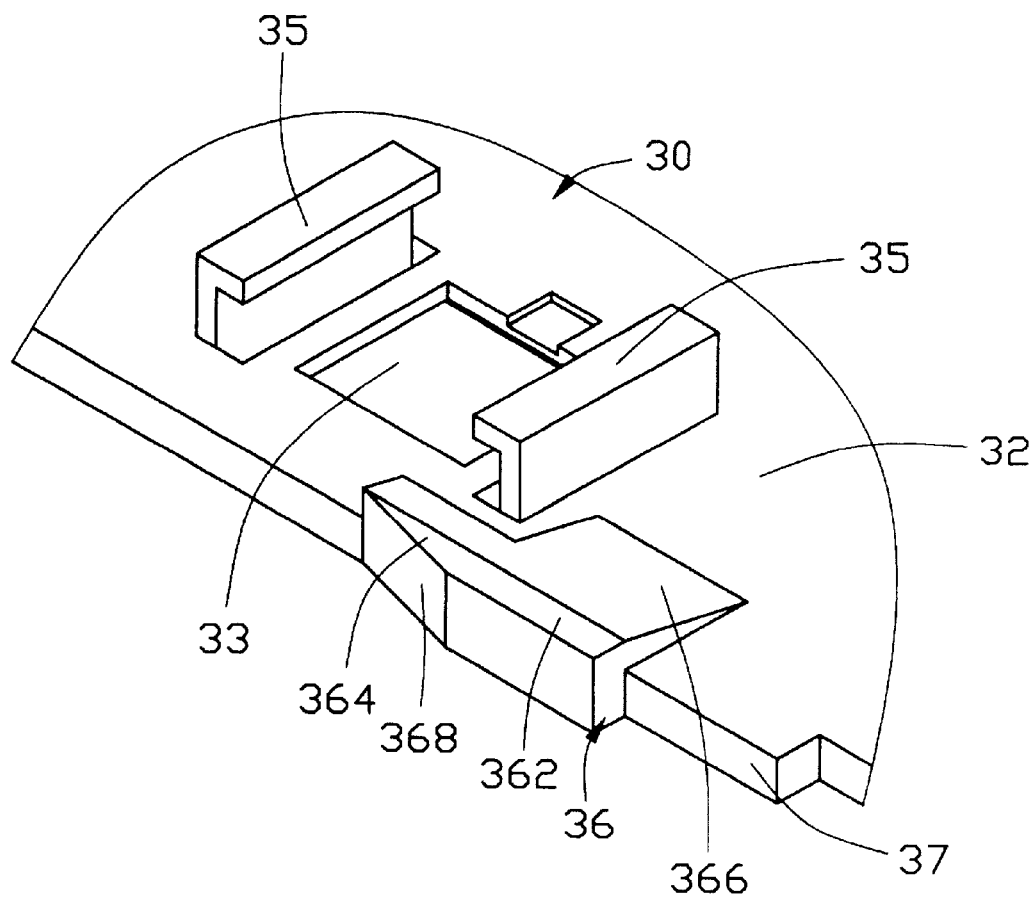
FIG. 3 is a partial perspective view of a cover of the electrical socket of FIG. 1.
Figure 4:
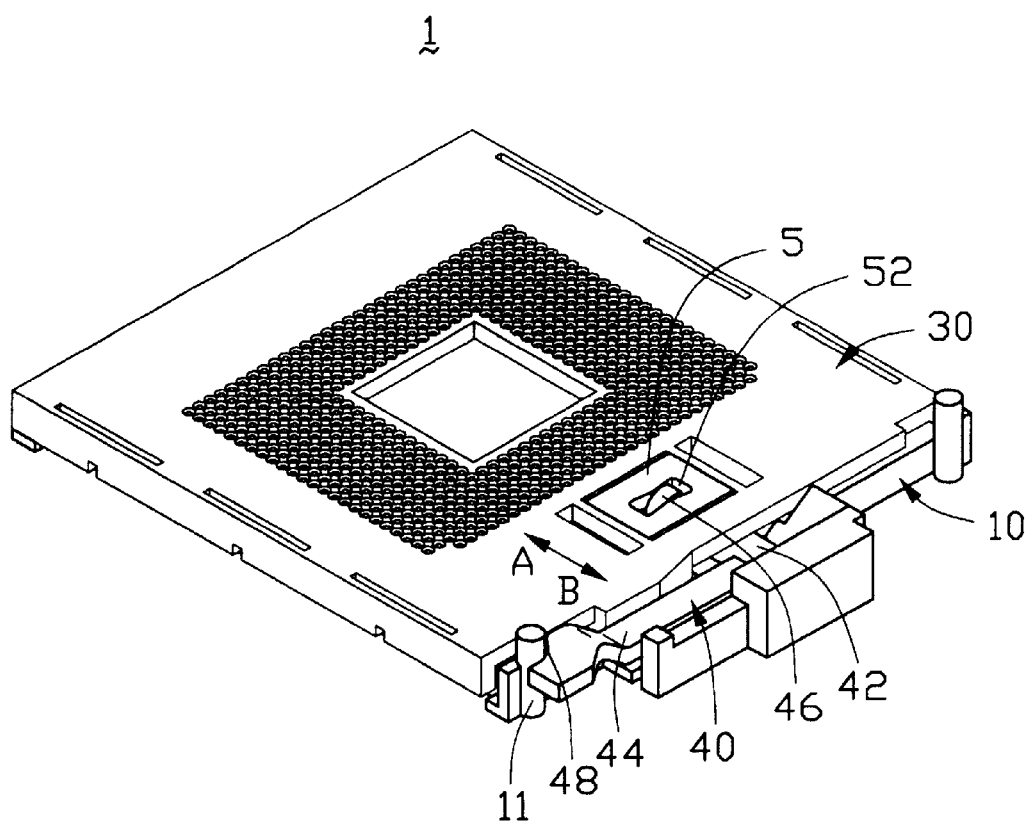
FIG. 4 is an assembled view of FIG. 1.
Figure 5:
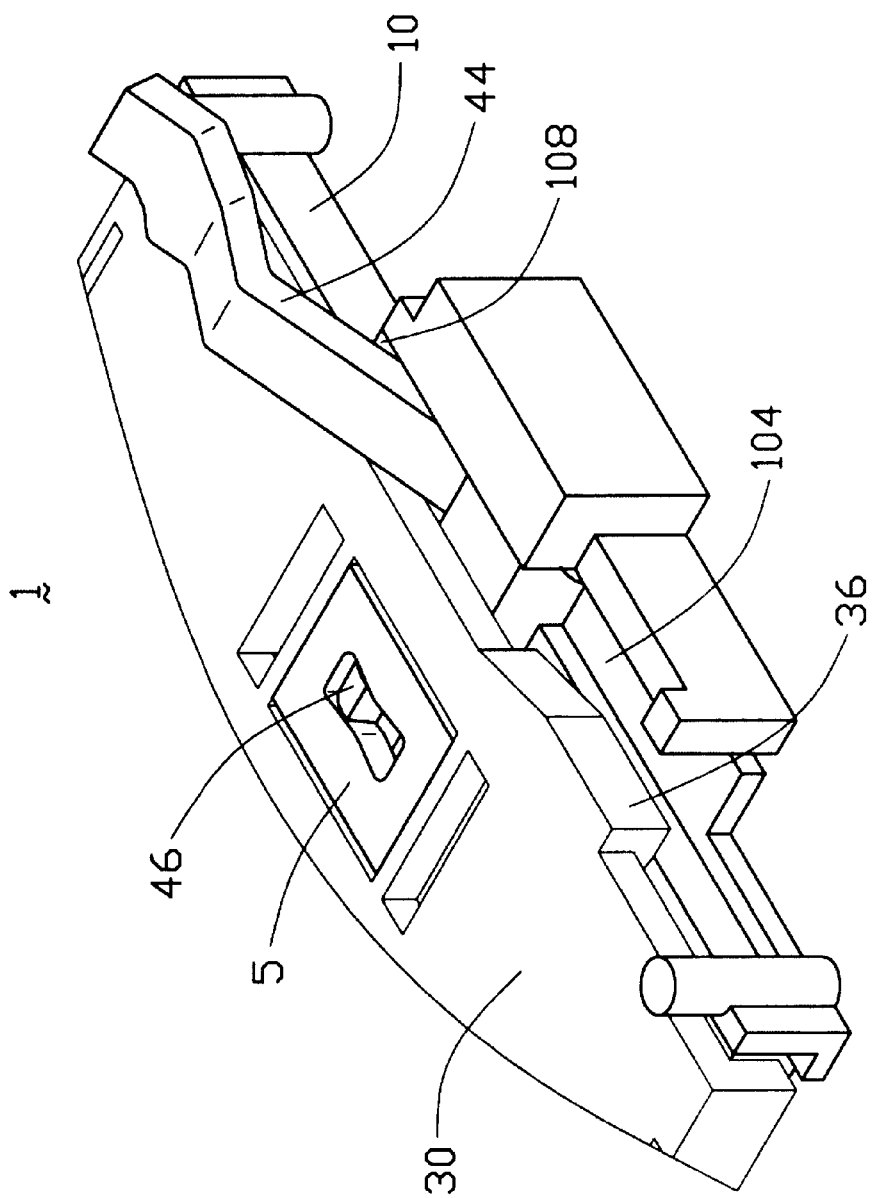
FIG. 5 is partial perspective view of FIG. 4 wherein an actuator member of the electrical socket is in a first position.
Figure 6:
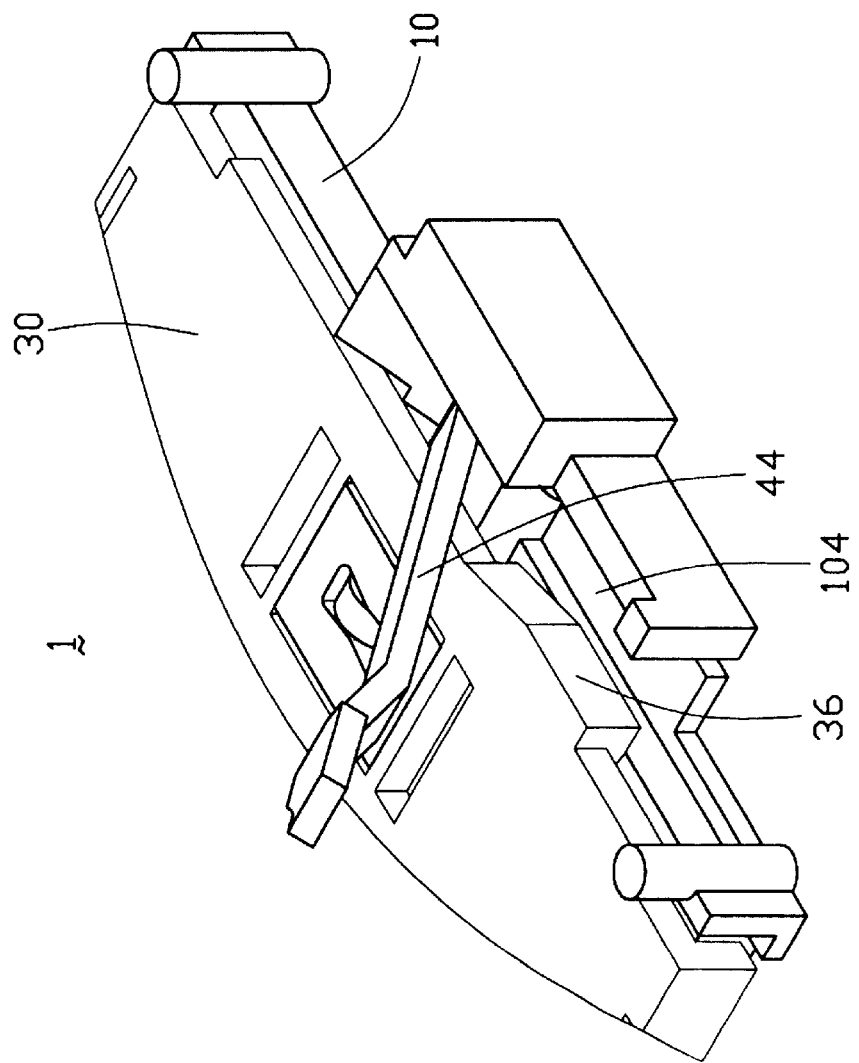
FIG. 6 is partial perspective view of FIG. 4 wherein the actuator member of the electrical socket is in a second position.
Figure 7:
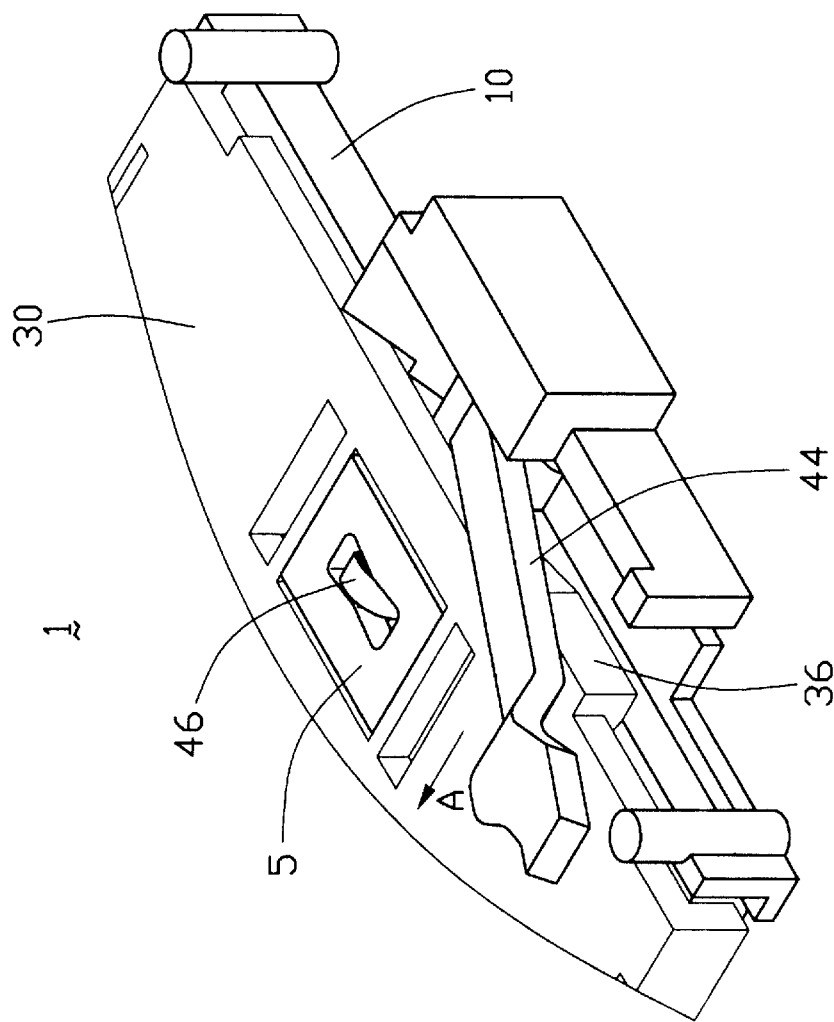
FIG. 7 is partial perspective view of FIG. 4 wherein the actuator member of the electrical socket is in a third position.
Figure 8:
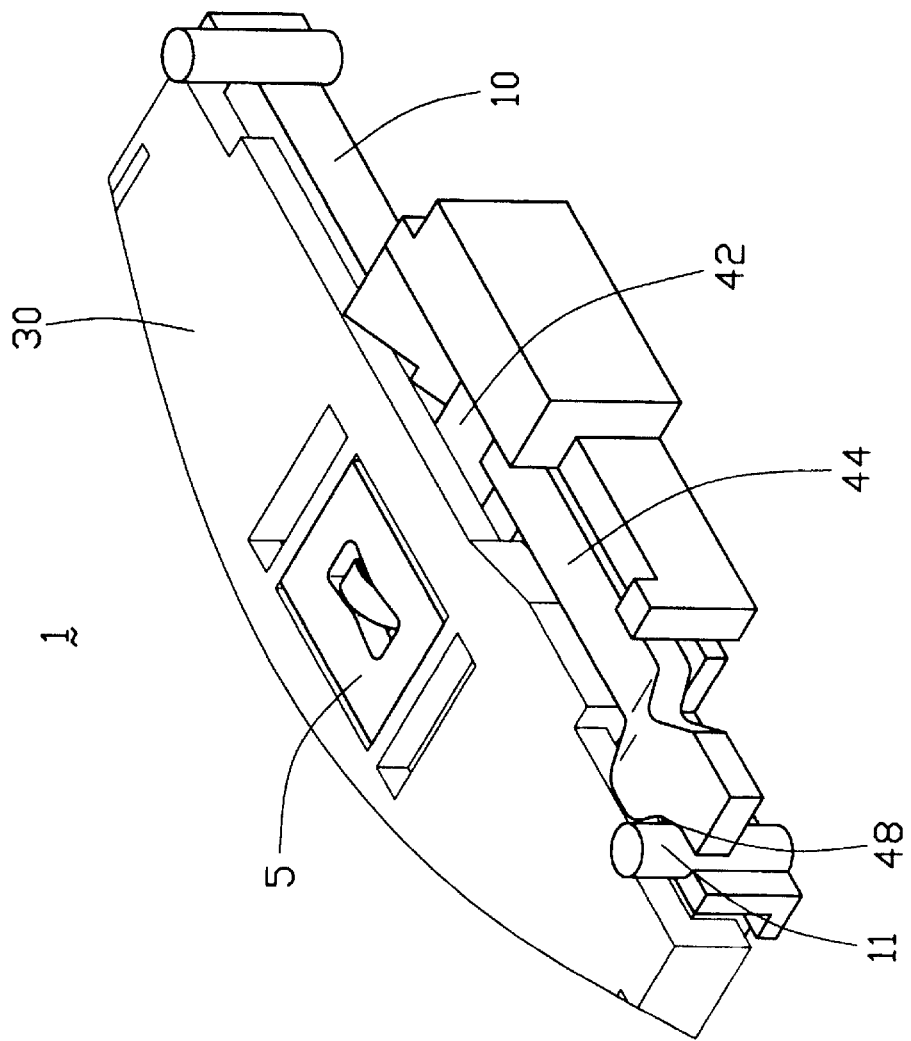
FIG. 8 is partial perspective view of FIG. 4 wherein the actuator member of the electrical socket is in a final position.

Referring to FIGS. 1 and 3, the movable cover 30 defines an array of pin holes 31 vertically corresponding to the terminal holes 103 of the base 10 for insertion of pins of the integrated circuit chip (not shown). A through aperture 33 is defined at one side of the cover 30 corresponding to the receiving chamber 102 of the base 10. A pair of hook members 35 depend from a bottom face 32 of the cover 30 for insertion through the receiving slots 1020 and hooking a bottom surface of the base 10. Additionally, a projection number 36 is formed on the bottom face 32 of the cover 30 and adjacent to the through aperture 33. The projection number 36 has a similar contour to the recessed portion 109 of the base 10 for slidably engaging with the recessed portion 109. The projection member 36 forms a body portion 362 and a narrow portion 364 having an outer bevel edge 366, both of which outwardly extend beyond an adjacent side edge 37 of the cover 30. The projection member 36 further forms a slanted surface 366 tapered toward inside of the cover 30 for facilitating moving in the recessed portion 109 of the base 10.

Referring to FIG. 1 again the actuator member 40 has a cam shaft 42 and an operating handle 44 vertically extending from the cam shaft 42 for respectively inserting into the receiving chamber 102 and the receiving slot 104 of the base 10. The cam shaft 42 has a step shape and forms a lead screw portion 46 for moving the cover 30 with respect to the base 10 and a supported end 43. The operating handle 44 can be pushed to rotate from its horizontal or close position where the pins of the integrated circuit chip are mechanically and electrically connect with the conductive contacts to its vertical or open position where the pins of the integrated circuit chip are disconnect from the conductive contacts. The operating handle 44 defines a cutout 48 to latch with the post 11 of the base 10 to stop the actuator member 40 in position.

Referring to FIG. 1 again, several minor components of the CPU socket 1 are shown, such as a cover plate 5, a shaft clip 6 and a pair of latching plate 7. The cover plate 5, made of metal material, is attached to the cover 30 around the through aperture 33 by insert molding or screw members (not shown). An irregular hole 52 is defined in the cover 5 for insertion of the screw cam portion 46 of the actuator member 40. The shaft clip 6 is inserted into the receiving slit 1024 of the base 10 and forms a bump 62 abutting against the supported end 43 of the cam shaft 42 for fixing the actuator member 40 in position. The pair of latch plates 7 are adapted for insertion into the through slots 1020 of the base 10 and beside the pair of hooks 35 of the cover 30 for preventing the cover 30 from breaking off the base 10.

In assembly, referring to FIGS. 1 to 3, after the conductive contacts are inserted into corresponding terminal holes 103 of the base 10, the actuator member 40 is inserted into the receiving space 100. Meanwhile, the cam shaft 42 is received in the receiving chamber 102 and one end thereof is supported in the opening 1022, and the operating handle 44 is received in the receiving slot 104 and stopped by the stopping post 11. Then, the shaft clip 6 is inserted into the receiving slit 1024 of the base 10 and the bump 62 abuts against the cam shaft 42 for fixing the actuator member 40 in position. The cover 30 combined with the cover plate 5 is then covered onto the base 10. The hooks 35 and the projection member 36 of the cover 30 are inserted into corresponding through slots 1020 and the recessed portion 109 of the base 10, respectively. At last, the pair of latching plates 7 are interferingly inserted into the through slots 1020 and beside the hooks, thereby preventing the cover 30 from breaking off from the base 10.

In use, referring to FIGS. 5 to 8, with the operating handle 44 of the actuator member 40 rotating from its horizontal direction to its vertical direction or the adverse, the cover 30 is thus pushed to move horizontally with respect to the base 10 along an "A" direction or the adverse direction "B" for connecting or disconnecting the pins of the integrated circuit board mounted thereon from the conductive contacts of the CPU socket 1. In good performance of the actuator member 40 and the cover 30 is not crept, the cover 30 effectively moves with the operation of the actuator member 40 and the projection member 36 thereof can not be touched by the actuator member 40. After being repeatedly operated or due to infrared, the cam shaft 42 of the actuator member 40 is worn or the cover 30 creeps, such that the cover 36 can not effectively move or even stagnant. At this situation, the operating handle 44 of the actuator member 40 will push the projection member 36 to move during its rotating from the vertical position to the horizontal position so that the cover 30 moves effectively along the direction "A" to obtain its closed position, thereby effectively connecting the pins of the integrated circuit chip with the conductive contacts of the CPU socket 1. This function of the projection member 36 is thus called a backup feature. Understandably, the projection member may be formed on the operating handle alternately, as long as the engagement between the operating handle and the cover may guarantee the true position of the cover with regard to the base in the closed position.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical socket for supporting an integrated circuit chip to electrically connecting to a circuit board, comprising:

a non-conductive base defining a vertical stopping post at one end thereof, an array of terminal holes, a receiving space in one side thereof and a recessed portion in a top face thereof;

a plurality of conductive contacts received in the terminal holes;

a slidable cover being mounted on the non-conductive base and defining an array of pin holes corresponding to the terminal holes for insertion of pills of the integrated circuit chip, the cover further forming a projection member at one side edge thereof for being slidablely received in the recessed portion; and an actuator member being received in the receiving space for moving the slidable cover wit respect to the non-conductive base and pushing the projection member to move in the recessed portion once an intended stroke for moving the cover is not enough, thereby effectively moving the cover to a closed position where the pins of the integrated circuit chip are mechanically and electrically connected with the conductive contacts; wherein the projection member forms an inclined surface tapered toward an inside of the cover for facilitating movement in the recessed portion of the base; wherein the actuator member has a cam shaft for moving the cover with respect to the base and an operating handle vertically extending from the cam shaft and having a cutout, and wherein the receiving space includes a receiving chamber and a receiving slot communicated with the receiving chamber for receiving the cam shaft and the operating handle, respectively; wherein the operating handle is rotatable from a horizontal position to a vertical position with respect to the cam shaft and pushes the projection member of the cover to move in the recessed portion once the intended stroke for moving the cover is not enough, and wherein the cutout latches with the post to stop the actuator member from moving.

2. The electrical socket as claimed in claim 1, wherein the recessed portion has a wide recess and a narrow recess communicated with the wide recess.

3. The electrical socket as claimed in claim 2, wherein the projection member extends beyond the side edge of the cover and forms a wide portion and a narrow portion for being respectively received in the wide recess and the narrow recess, the narrow portion having an outer bevel edge.

4. The electrical socket as claimed in claim 1, wherein the base defines an opening communicated with the receiving chamber for supporting the cam shaft of the actuator member therein.

5. The electrical socket as claimed in claim 4, wherein the base further defines a slit communicated with the opening, and a shaft clip of the electrical socket is received in the slit for abutting against the cam shaft.

6. The electrical socket as claimed in claim 1, wherein the base defines a pair of through slots beside the receiving chamber, and wherein the cover forms a pair of hooks depending from a bottom face thereof for insertion into the through slots to hook a bottom face of the base.

7. The electrical socket as claimed in claim 6, further comprising a pair of latching plates interferingly received in the through slots beside the hooks of the cover.

* * * * *